United States Patent [19]

Hoffmann

[11] Patent Number: 4,742,490

[45] Date of Patent: May 3, 1988

[54] INTEGRATED SEMICONDUCTOR MEMORY

[75] Inventor: Kurt Hoffmann, Taufkirchen, Fed. Rep. of Germany

[73] Assignee: Siemens Aktiengesellschaft, Berlin and Munich, Fed. Rep. of Germany

[21] Appl. No.: 811,932

[22] Filed: Dec. 20, 1985

[30] Foreign Application Priority Data

Dec. 28, 1984 [DE] Fed. Rep. of Germany ....... 3447762

[51] Int. Cl.⁴ .............................................. G11C 7/00
[52] U.S. Cl. ..................................... 365/201; 371/21
[58] Field of Search ................ 371/21, 25; 324/73 R; 365/201, 200

[56] References Cited

U.S. PATENT DOCUMENTS 4,541,090 9/1985 Shiragasawa ........................ 371/21

FOREIGN PATENT DOCUMENTS 0127015 7/1981 European Pat. Off. .
0046215 5/1984 European Pat. Off. .

OTHER PUBLICATIONS

S. Eaton et al., "A 100 ns 64K Dynamic RAM using Redundancy Techniques", 1981 IEEE International Solid-State Circuits Conference-Digest of Technical Papers, Feb. 1981, pp. 84–85.
Publication Elektronik, No. 15, Jul. 30, 1982, pp. 27–30, P. Mattos et al., "Nibble-Mode beschleunigt Speicherzugriff".
Patents Abstracts of Japan, vol. 6, (P-111), (940), No. 62, Apr. 1982.

Primary Examiner—Joseph A. Popek
Attorney, Agent, or Firm—Herbert L. Lerner; Laurence A. Greenberg

[57] ABSTRACT

Integrated semiconductor memory includes n identical memory cell fields, each having a data width equal to m, n . m data lines for writing-in and reading-out memory data into and out of the memory cell fields, m first data separators each having an assigned data input terminal for applying the memory data as a function of addressing data when written-in, m second data separators for selecting one of the n data lines in response to the addressing data when reading out the memory data and for applying the memory data to the outputs of the second data separators, data output terminals for receiving the memory data, evaluation circuits connected to data lines for feeding data to the data output terminals in response to a control signal for activating an error signal to the data output terminals upon the occurrence of faulty memory data, third data separators for transferring the memory data in parallel to all of the n data lines in response to the control signal, and fourth data separators for selectively feeding either the memory data selected by the second data separators or the output signal generated by the evaluation circuit to the data output terminals in response to the control signal.

15 Claims, 7 Drawing Sheets

INTEGRATED SEMICONDUCTOR MEMORY

The invention relates to an integrated semiconductor memory with n identical storage cell fields, n . m data lines for writing-in and reading-out memory or storage data into and out of the memory cell fields, m first data separators each applying memory data to one of the n associated data lines when writing-in, the memory data being present at its assigned data input terminal to be written into the semiconductor memory as a function of addressing data, m second data separators each selecting one of the n data lines in dependence on addressing data when reading out memory data present at n respective data lines, and applying it through an output to a corresponding data output terminal.

Semiconductor memories of the above-mentioned type are known, for instance, from the publication IEEE International Solid-State Circuits Conference 1981, Pages 84 to 85 and from the publication Elektronik, No. 15, July 30, 1982, Pages 27 to 30. In semiconductor memories of this type, it is known to divide a total memory area for the user which has data interfaces 1 bit wide for data input and output, into n equal cell fields. For this purpose it is common to assign a data input line of its own to each cell field, internally to the memory, which are all connected to a data terminal through a first data separating circuit. During operation, the selection as to which of the n data lines is to be connected through to the data input terminal is made through the address input or a corresponding number of most significant address inputs. Similarly, the n data lines are connected to a data output terminal through a second data separator.

The value n is even-numbered. Furthermore, as is well known, it is equal to the number of desired cell fields and depends on whether simple address signals (i.e. only so-called X-addresses or Y-addresses) are applied or address signals which sequentially contain an X-address within a clock period of the semiconductor memory as well as a Y-address (address multiplex) at the address inputs, through which the semiconductor memory is addressed. In this case, n can only be a number divisible by 4.

Furthermore, semiconductor memories are also known which have data interfaces that are more than one bit wide for data inputs and outputs. Typical organization forms for this purpose are data interfaces with a width of m=4, 8 and 9 bits. Semiconductor memories constructed in this way contain more and more storage cells due to the progress in integration possibilities. However, the increase of storage cells per semiconductor memory necessitates increased costs in time, personnel and financing for the testing of semiconductor memories for the manufacturer as well as for the customer who in all probability performs a so-called "incoming inspection". Due to the special required structure of test patterns for testing, the time required for testing increases exponentially with an increase of storage cells. For this reason it is desirable for the testing time to be shortened significantly without having to decrease the efficiency of the test patterns being used. Although earlier attempts with integrated circuits, in which several semiconductor chips or modules were tested in parallel by an automatic tester, resulted in an excellent shortening of the testing time, the amount of mechanical means required for this purpose was very large (test prods on a wafer plane, measuring fixtures with cables on the module plane). In addition, existing testing programs had to be adapted in a complicated manner.

It is accordingly an object of the invention to provide an integrated semiconductor memory which overcomes the heretofore-mentioned disadvantages of the heretofore-known devices of this general type, and which makes it possible to shorten the testing time without the loss of efficiency of the test patterns being used.

With the foregoing and other objects in view there is provided, in accordance with the invention, an integrated semiconductor memory, comprising n identical memory cell fields, n . m data lines each being connected to a respective one of the memory cell fields for writing-in and reading-out storage or memory data into and out of the memory cell fields, m first data separators each being connected to the data lines and each having an assigned data input terminal for applying the memory data present at the assigned data input terminal to be written into one of the associated n data lines of the semiconductor memory as a function of addressing data when written-in, m second data separators each being connected to the data lines and each having an output for selecting one of the n data lines in dependence on the addressing data when reading out the memory data present at the n respective data lines and for applying the memory data to the outputs of the second data separators, data output terminals connected to the outputs of the second data separators for receiving the memory data, first terminal means for providing a control signal, second terminal means for providing a signal complementary to the control signal, evaluation circuits each having an output and each being connected to the first terminal means and always to n of the n . m data lines parallel to the respective second data separators for feeding or connecting through the memory data read out from the memory cell fields to the outputs of the evaluation circuits and in turn to the corresponding data output terminals in dependence on the control signal on one hand, and for giving fault information to the corresponding data output terminals upon the occurrence of at least one faulty memory data on the other hand, third data separators connected to the first terminal means and connected between each of the m data input terminals and the associated n of n . m data lines parallel to the respective first data separators for transferring the memory data to be written into the semiconductor memory in parallel to all of the n data lines in dependence on the control signal, and fourth data separators each being connected to the first and second terminal means and each preceding one of the data output terminals or being connected between a respective one of the m data output terminals and the outputs of a respective one of the second data separators and of a respective one of the evaluation circuits for selectively feeding either the memory data selected by the second data separators or the output signal generated by the evaluation circuit to the data output terminals in dependence on the control signal and the complementary signal. The basic object of the invention is to construct a semiconductor memory in such a way that although it can be operated in a customary or normal manner, it is possible in a test case to connect partial regions of the semiconductor memory in parallel, internal to the memory, and thereby to pick up read-out data as well as possibly occurring errors by measurement at a memory terminal, pad or pin.

In accordance with another feature of the invention, each of the evaluation circuits comprises means for feeding through the memory data read out from the memory cell fields, the feeding means including a setting circuit having an output, a first multivibrator circuit having a setting input connected to and activated by the data lines if all n data lines connected to the evaluation circuit have a first logical state (o. k.case), a resetting input connected to and activated by the data lines if all of the data lines connected to the evaluation circuit have a second logical state complementary to the first logical state, and an output connected to the output of the evaluation circuit being intentionally set or reset if all n data lines have the same logical state, a second multivibrator circuit having an output connected to the output of the evaluation circuit, a resetting input connected to the data lines for resetting the output of the second multivibrator circuit if all data lines connected to the evaluation circuit together have neither the first nor the second logical states, and a setting input connected to and addressed by the output of the setting circuit for setting the output of the second multivibrator circuit.

In accordance with an added feature of the invention, each of the setting circuits includes a differentiating stage having an output connected to the output of the setting circuit and an input for receiving the control signal from the first terminal means and for receiving a supply voltage for the semiconductor memory, and an AND function device having an output connected to the output of the setting circuit, an input connected to the setting input of the first multivibrator circuit, and another input for receiving a machine clock frequency.

In accordance with yet an added feature of the invention the machine clock frequency delays the setting inputs of the second multivibrator circuits within a given clock period until a test circuit connected to the data output terminal has recognized an error signal which may have been activated during a previous clock period.

In accordance with an additional feature of the invention, each of the evaluation circuits includes a logic function device having an output forming the output of the evaluation circuit, and two inputs each being connected to a respective one of the outputs of the multivibrator circuits.

In accordance with a further feature of the invention, each of the third data separators includes n transistors each being connected between an associated data input terminal and a respective one of the data lines for the data input terminal, and the transistors have gates connected in parallel to the first terminal means.

In accordance with yet another feature of the invention, each of the m fourth data separators each include first and second transistors having source, drain and gate terminals, the drain terminals of the first and second transistors being connected together to an associated data output terminal, the source terminal of the first transistor being connected to the output of an associated second data separator, the source terminal of the second transistor being connected to the output of an associated evaluation circuit, the gate terminal of the first transistor being connected to the second terminal means, and the gate terminal of the second transistor being connected to the first terminal means.

In accordance with yet an additional feature of the invention, the first terminal means is a separate terminal used exclusively for the control signal.

In accordance with yet an added feature of the invention, the first terminal means is a terminal which is also used for other signals from the semiconductor memory.

In accordance with yet a further feature of the invention, the first terminal means receives the most significant of the addressing signals during normal operation.

In accordance with still an additional feature of the invention, the control signal is at a higher potential than that which corresponds to a logical "1", for switching from normal operation to testing operation in which the evaluation circuits are used.

In accordance with still an added feature of the invention, the first terminal means includes a discriminator circuit for recognizing whether or not the higher potential is applied and for activating the control signal.

In accordance with a concomitant feature of the invention, the integrated semiconductor memory includes n identical memory cell fields, n . m data lines each being connected to a respective one of the memory cell fields for writing-in and readingout memory data into and out of the memory cell fields, m first data separators each being connected to the data lines and each having an assigned data input terminal for applying the memory data present at the assigned data input terminal to be written into one of the n data lines of the semiconductor memory as a function of addressing data when written-in, m second data separators each being connected to the data lines and each having an output for selecting one of the n data lines in dependence on the addressing data when reading out the memory data present at the n data lines and for applying the memory data to the outputs of the second data separators, data output terminals connected to the outputs of the second data separators for receiving the memory data, terminal means for providing a control signal, evaluation circuits each having an output and each being connected to the terminal means and to n of the n . m data lines parallel to the respective second data separators for feeding through the memory data read out from the memory cell fields to the outputs of the evaluation circuits and in turn to the data output terminals in dependence on the control signal, and for giving fault information to the data output terminals upon the occurrence of at least one faulty memory data, third data separators connected to the terminal means and connected between each of the m data input terminals and the n of n . m data lines parallel to the first data separators for transferring the memory data to be written into the semiconductor memory in parallel to all of the n data lines in dependence on the control signal, and other terminals each being connected to a respective one of the outputs of the evaluation circuits and being used exclusively therefor.

The invention can be applied, among other things, to DRAM's and SRAM's as well as to EPROM's and EEPROM's.

Other features which are considered as characteristic for the invention are set forth in the appended claims.

Although the invention is illustrated and described herein as embodied in an integrated semiconductor memory, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which:

FIG. 2 is a diagram of a specific embodiment of an evaluation circuit AS;

Figure 1:
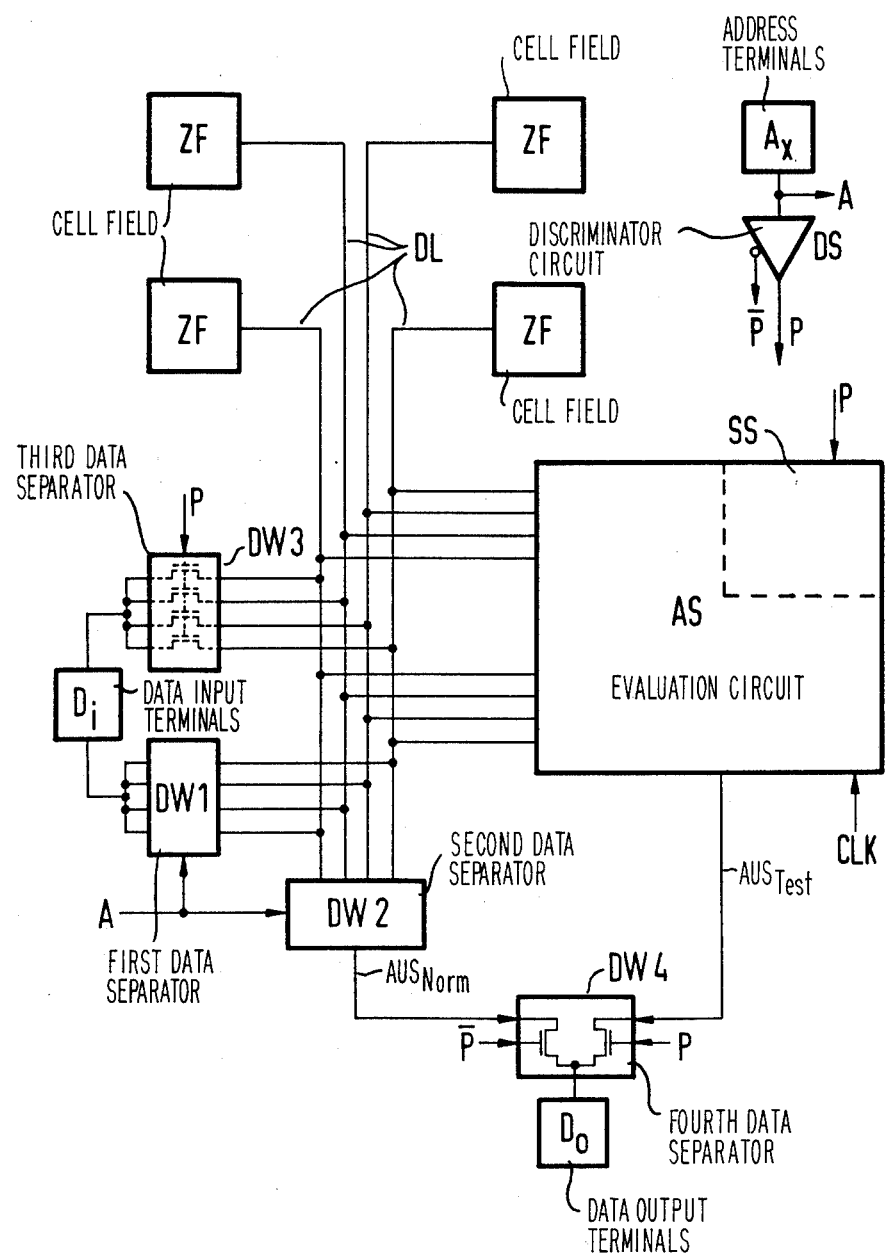
FIG. 1 is a block and schematic circuit diagram of a first embodiment of the invention.

Referring now to the figures of the drawings in detail and first, particularly, to FIG. 1 thereof, there is seen a semiconductor memory according to the invention with $m=1$ data input terminals $D_i$ and $m=1$ data output terminals $D_o$, that contains $n=4$ identical cell fields ZF (for instance, in a "megabit" memory, the total number of storage cells would be: 1024k . 1 bit=1M . 1 bit, which makes four cell fields ZF at 256k . 1 bit, with $n=4$). One of n data lines DL is connected to each cell field ZF. These lines serve for writing information into the cell field ZF and for reading it out. In a known manner, these $n=4$ data lines DL are connected to the data input terminal $D_i$ through a first data separator DW1. In order to write information into the memory, the information present during normal operation at the data input terminal $D_i$ is connected to one of the $n=4$ existing data lines DL by addressing the first data separator DW1 by means of a given address information, namely an addressing signal A which is present at the most significant terminal $A_x$ of the existing address terminals; from there, it is written into the corresponding cell field ZF. Similarly, the data lines DL are connected to the data output terminal $D_o$ through a second data separator DW2. This data separator is driven exactly like the first data separator DW1, as far as the address is concerned.

The second data separator connects one of the n data lines DL to the data output terminal $D_o$. These parts of a semiconductor memory according to the invention described so far are already known by themselves. They are applied, for instance, in semiconductor memories which permit the so-called "nibble-mode" of operation.

The semiconductor memory according to the invention therefore advantageously contains a third data separator DW3 parallel to the first data separator DW1, by means of which information present in testing operation at the data input terminal $D_i$ is simultaneously transferred to all $n=4$ data lines DL. For instance, the third data separator DW3 can contain $n=4$ parallel-connected transistors, one side of the conduction paths thereof being connected together to the data input terminal $D_i$ and the other sides of the conduction paths thereof each being connected to one data line DL. The gates of the transistors of the third data separator DW3 are driven by a control signal P, the generation of which will be described below. If information is written into the cell fields ZF through this third data separator DW3, these cell fields ZF then each contain the same information as the others.

If each of the cell fields ZF is considered during a testing operation as a memory of its own (test piece), the (test) information which must be adapted to a cell field ZF as far as the address is concerned, can simultaneously be written in parallel into all of the cell fields ZF.

Figure 3:
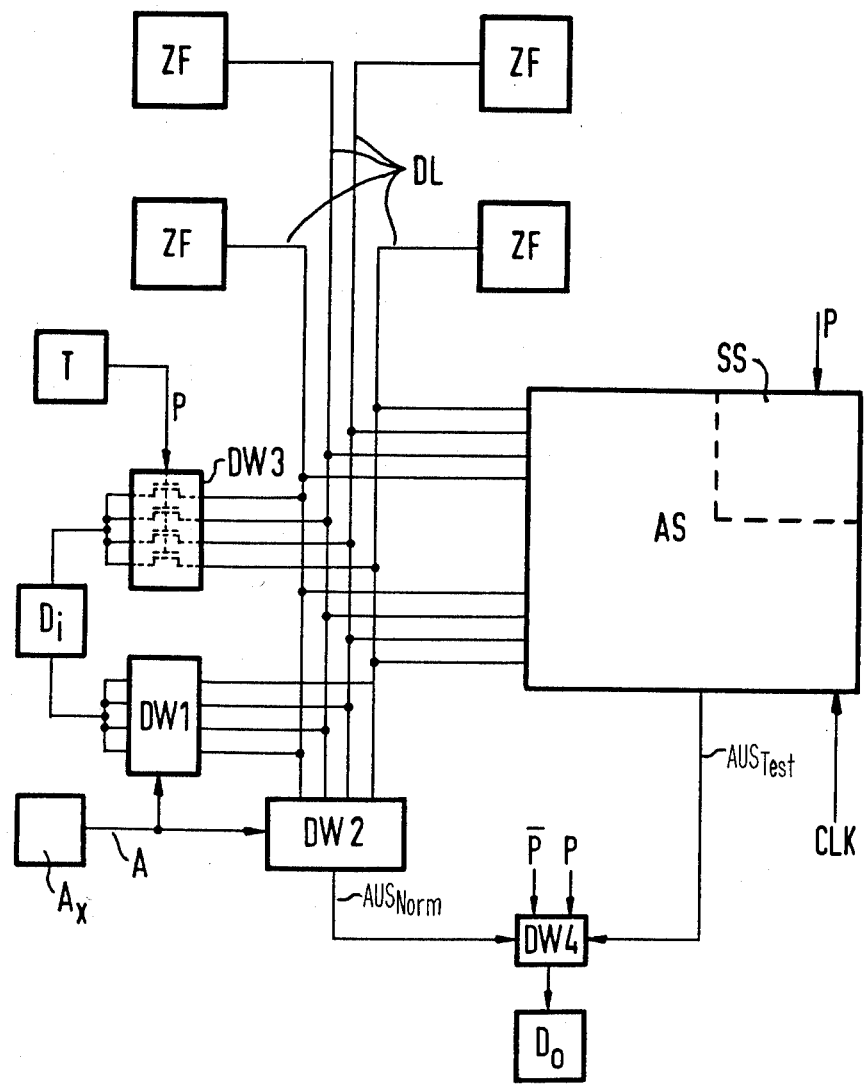
FIG. 3 is a block and schematic circuit diagram of a second embodiment of the invention.

The control signal P which activates the third data separator DW3, can be obtained in different ways. In an embodiment according to FIG. 3, a test signal in the form of a constant potential (for instance a logical '1') is applied when testing at a further terminal T. In normal operation, either a constant potential, such as with a value logical '0' is applied, or the terminal T remains unconnected. The control signal P generated in this manner, can be taken off directly at the terminal T and then addresses the gates of the third data separator DW3 among other things, so that the transistors thereof conduct. On one hand, this construction has the advantage of permitting a potential value to be selected, which is also used otherwise for addressing the semiconductor memory (for instance "TTL-level"). On the other hand, however, an additional terminal is required for the terminal T which in some circumstances may not be available due to the dimensions of the case of the semiconductor memory.

In another embodiment, shown in FIG. 1, a terminal which is used concurrently is otherwise used for normal operation. The the most suitable terminal is an available terminal which serves for addressing the semiconductor memory with address information, especially information regarding the most significant X and Y or X/Y information (with the presently customary address multiplex method). In normal operation, for instance, a (most significant) address signal A is applied to such a terminal with a '0' level of 0 volts and a '1' level of 5 volts, with presently customary semiconductor memories. In the embodiment of the semiconductor memory according to FIG. 1, this terminal is generally designated with reference symbol $A_x$. In the normal case, the terminal carries the most significant X/Y address information. In order to carry out the testing operation, a potential is applied which is, for instance, clearly above the '0' level of the customary address signal A present at the address terminal $A_x$, such as 10 V. A subsequent discriminator circuit DS recognizes this applied potential and generates the control signal P internally in the semiconductor memory. Discriminator circuits DS are known in the art, such as in the form of threshold value switches. Prior art threshold value switches can be seen, for instance, in German Published, Non-Prosecuted Applications DE-OS No. 30 30 852 and DE-OS No. 33 18 564. However, other embodiments according to the state of the art are also conceivable.

Furthermore, a semiconductor memory according to the invention also contains m identical evaluation circuits AS (m=width of the data interfaces for data input and output).

It is the task of each of these evaluation circuits AS to take over information present on the n data lines DL assigned to the respective evaluation circuit AS when reading out from the semiconductor memory; to pass the information on to the data output terminal $D_o$ through an output $Aus_{Test}$, when all of these pieces of information are equal to each other (which corresponds to the "0. K." case due to the previously occurring parallel deposition into the cell fields ZF), to activate an error signal at their output $Aus_{Test}$ when these data are not equal to each other (error case); and to permit this to be present at the data output terminal $D_o$ until, for instance, it can be recognized by an automatic tester connected to the data output terminal $D_o$ as an activated error signal. Due to the binary logic used, this activated error signal has the value logical '0' in the case of a fault (a reverse definition is, of course, also conceivable).

If a logical '1' is expected at the data output terminal $D_o$ as the read-out information during the testing of the semiconductor memory, due to a test pattern applied to the memory, the following three cases are possible:

(a) all cell fields ZF operate correctly: every one of the n=4 data lines DL receives a logical '1' from a storage cell of its assigned cell field ZF, just being addressed, which passes on the evaluating circuit AS to the data output terminal $D_o$ and is recognized as "0. K." by the automatic tester;

(b) all cell fields ZF are defective at the storage cells just being addressed (this is extremely improbable as an individual error; in general, this is almost a total failure of the semiconductor memory) through the data line DL, and only logical '0' signals are read out which the automatic tester recognizes as a defect, although the evaluation circuit AS does not recognize them as defects and therefore passes them on as a logical '0' to the data output terminal $D_o$;

(c) from 1 to n-1 cell field(s) ZF contain a faulty addressed storage cell: the evaluation circuit AS recognizes this, activates the fault signal at its output and passes it on, for instance, as a logical '0' to the data output terminal $D_o$. The automatic tester recognizes the fault.

If, on the other hand, a logical '0' is expected at the data output terminal $D_o$, the cycle in cases (a) and (b) is analogous to having a logical '1' as the expected information, but although the error in case (c) is recognized as such within the evaluation circuit AS, the error signal at the output $AUS_{Test}$ of the evaluation circuit AS is activated. However, this does not differ as to its level ("0") from the expected information (likewise "0"). Nevertheless, In this case the error signal remains activated, due to the advantageous embodiment of the evaluation circuit AS which will be described below, until a logical "1" is read out which, however, is not passed-on to the data output terminal $D_o$, due to the previously occurring error. Instead, the fault signal (logical '0') remains activated, i.e. the automatic tester notices the error. Subsequently, the evaluation circuit AS deactivates the error signal again through a built-in setting circuit SS. This is completely sufficient for conventional production tests at the manufacturer's premises (on the wafer plane, with and without redundant storage cells, and in the module plane) as well as for incoming inspection at the customer's premises; testing for analytical purposes or the like is not possible because of the inaccuracy of the addressing in the parallel testing of a semiconductor memory (ascertaining which cell field ZF is defective).

Figure 2:
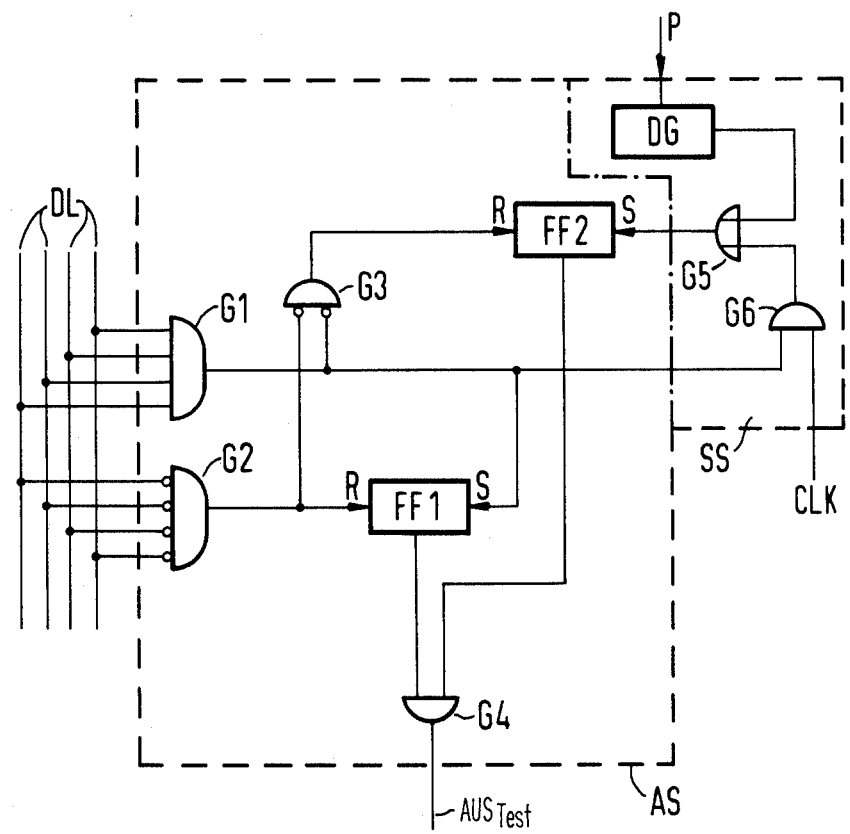

One possible advantageous embodiment of the selection circuit AS is shown in FIG. 2 and will be explained below.

A first AND gate G1 has n=4 inputs. Each of these inputs is connected to a respective one of the n=4 data lines DL. A second AND gate G2 is connected parallel to the input of the first AND gate G1. However, the n=4 inputs thereof are negated so that the second AND gate G2 operates with a NOR function. The first AND gate G1 switches to a logical "1" at its output only if all data lines DL are at logical "1". The same applies to the output of the second AND gate G2 (the output is a logical "1" only if all of the data lines DL are at logical "0").

The evaluation circuit AS furthermore contains a first multivibrator circuit FF1, which may be in the form of an RS flipflop with setting and resetting inputs S,R as well as with one output. The setting input S is connected to the output of the first AND gate G1 and sets the output of the first multivibrator circuit FF1 to logical "1", if a logical "1" is present at all of the inputs of the first AND gate G1. Similarly thereto, the resetting input R is connected to the output of the second AND gate G2. The output of the multivibrator circuit FF1 is therefore set if a logical "1" is present at all of the n=4 data lines DL and is correspondingly reset if a logical "0" is present at all data lines DL correspondingly. In the event of a fault, none of these conditions is met; the first multivibrator circuit FF1 does not change its output.

The outputs of the two AND gates G1, G2 are connected in negated form to a third AND gate G3, parallel to the terminals of the two inputs of the first multivibrator circuit FF1. The third AND gate G3 therefore also operates with a NOR function. The output of the third AND gate G3 is at a logical "1" only if a fault is present, i.e. if not all of the n=4 data lines DL have the same logical level ("0" or "1"). In the event of such a fault, it resets a resetting input R of a second multivibrator circuit FF2 which can be of the same construction as the first multivibrator circuit FF1. The second multivibrator circuit FF2 also has a further setting input S, which is controlled by a setting circuit SS.

The second multivibrator circuit FF2 has an output which is set by the setting input S to logical "1" and is set by the resetting input R to logical "0". Since the resetting input R is always activated in the event of a fault, the following can also be said: the output of the second multivibrator circuit FF2 is reset in the event of a fault (=to logical "0"), and is otherwise either set (logical "1") or it remains unchanged.

The outputs of the two multivibrator stages FF1, FF2 form two inputs of a fourth AND gate G4, the output ($AUS_{Test}$) of which is identical with that of the evaluating circuit AS. The output $Aus_{Test}$ makes available the information read out from the cell fields ZF ("0" or "1"), if the semiconductor memory to be tested is 0.K. (0.K. case). During the process, even a measurement of the memory access time can be made. In order for the information can be made available it is necessary to set the output of the second multivibrator circuit FF2 to logical "1" through its setting input S. This is accomplished by means of the setting circuit SS which will be described below. In the event of a fault, however, the output of the second multivibrator circuit FF2 is reset to logical "0"; the output $AUS_{Test}$ of the evaluation circuit AS and therefore that of the fourth AND gate G4 is independent of the data expected (in the 0.K. case) at logical "0" (fault signal). As already mentioned, however, the fault signal cannot be differentiated from information which may be expected as a logical "0" and can be read out from the memory.

The setting circuit SS which has an output that forms the setting input S of the second multivibrator FF2, has the two partial purposes:

(a) After the occurrence of a fault, the setting circuit SS must keep the output of the second multivibrator circuit FF2, and thus the fault signaling an active state (=logical "0") at the output of the evaluating circuit AS through the corresponding input of the fourth AND gate G4. It is therefore possible to "store" a fault which occurred in reading a logical "0" from the cell fields ZF, since it is not recognizable at the output of the evaluation circuit AS (explained above) until a logical "1" is to be read for the first time from the cell fields ZF (whether faulty or correct, no difference occurs in the evaluation). In any event, the information logical "1" expected at the output of the fourth AND gate G4 differs in any event from the activated error signal "0".

(b) The setting circuit SS must ensure that the output of the second multivibrator circuit FF2 never simulates a fault when test operation or supply voltage is first switched on, i.e. it must be set to logical "1". This is done, for instance, by a conventional differentiation stage DG, which is triggered by the control signal P and delivers a pulse which is interpreted by a first input of an OR gate G5 as a logical "1" and forms an output of the setting circuit SS as well as the setting input S of the second multivibrator circuit FF2 and sets the output of the second multivibrator circuit FF2 to logical "1".

Figure 7:
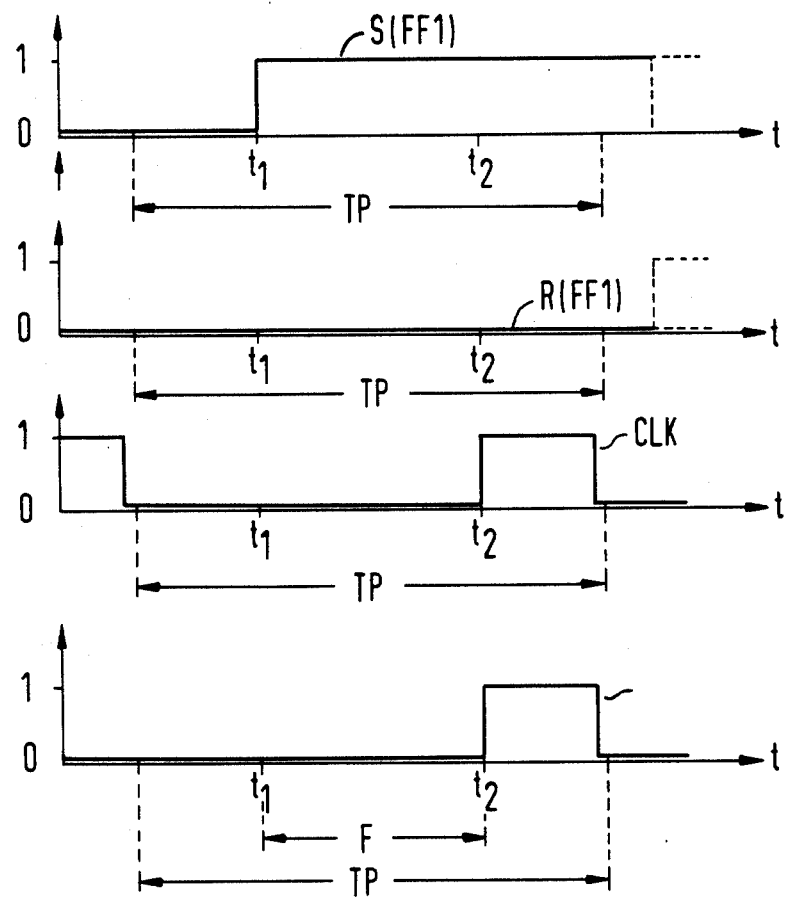
FIG. 7 is a timing diagram which shows how premature resetting of faulty information is prevented.

The condition designated with reference symbol (a) above which is required of the setting circuit SS, is fulfilled by the following (partial) circuit: The output of the first AND gate G1, which acts on the first multivibrator circuit FF1 as a setting input S and which acts as a first input of the third AND gate G3, is also connected as an input of a further AND gate G6. A second input of this AND gate G6 receives a machine clock frequency CLK. If a positive pulse of the machine clock frequency CLK is delivered, the first input of the AND gate G6 is therefore connected through to its output, which in turn acts as the second input of the OR gate G5 and therefore as the setting input S for the second multivibrator circuit FF2. If the occurrence of the machine clock frequency CLK is placed at a suitable point in time $t_2$ shown in FIG. 7 within a clock period TP by which the semiconductor memory is operated, deactivation of the error signal which had been activated due to a fault that had occurred in previous clock periods TP, can be delayed from a point in time $t_1$ at which a logical "1" is recognized by the first AND gate G1 to a point in time $t_2$, i.e. an automatic tester can recognize a fault F which has occurred, for instance, between the two points in time $t_1$ and $t_2$. On the other hand, the output of the first AND gate G1 can be ultimately connected through to the setting input S of the second multivibrator stage after the point in time $t_2$, if this output is at logical "1". However, the output of the second multivibrator FF2 is thereby set to logical "1", which corresponds to deactivation and resetting of the fault signal.

The embodiment of the invention according to FIG. 1 furthermore advantageously includes a fourth data separator DW4 for each bit of width m of the interfaces, which serves for connecting the information $AUS_{Norm}$ from the respective second data separator DW2 to the respective data output terminal $D_o$ during normal operation, and for connecting the output of the $AUS_{Test}$ of the respective evaluation circuit AS to the corresponding terminal $D_o$ instead, during test operation. This purpose is served by two transistors for each fourth data separator DW4. The source terminals of the transistor are connected together to the corresponding data output terminal $D_o$. The drain terminal of the one transistor is connected to the output of the second data separator DW2, while the drain terminal of the other transistor is connected to the output of the evaluation circuit AS. The transistor connected to the second data separator is driven gate-wise by a signal $\overline{P}$ which is complementary to the control signal P; the other transistor is driven by the control signal P. It is therefore possible to selectably switch the output of the second data separator DW2 or the output of the evaluation circuit AS to the data output terminal $D_o$ selectably.

Figure 4:
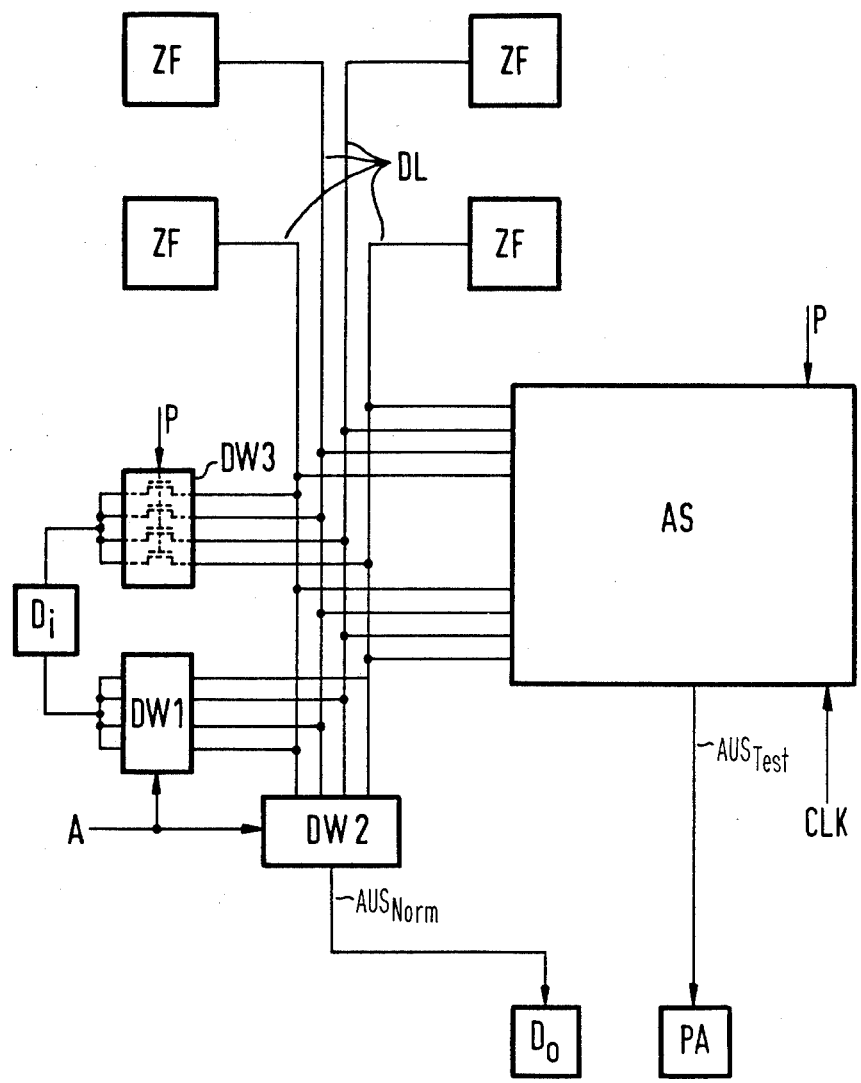
FIG. 4 is a block and schematic circuit diagram of a third embodiment of the invention.

However, it is also entirely possible in another embodiment, to directly connect the output of each of the second data separators DW2 to the corresponding data output terminal $D_o$ and to directly and separately connect the output of each evaluation circuit AS, to a terminal PA of its own, in the form of a test terminal. This embodiment is shown in FIG. 4.

Figure 5:
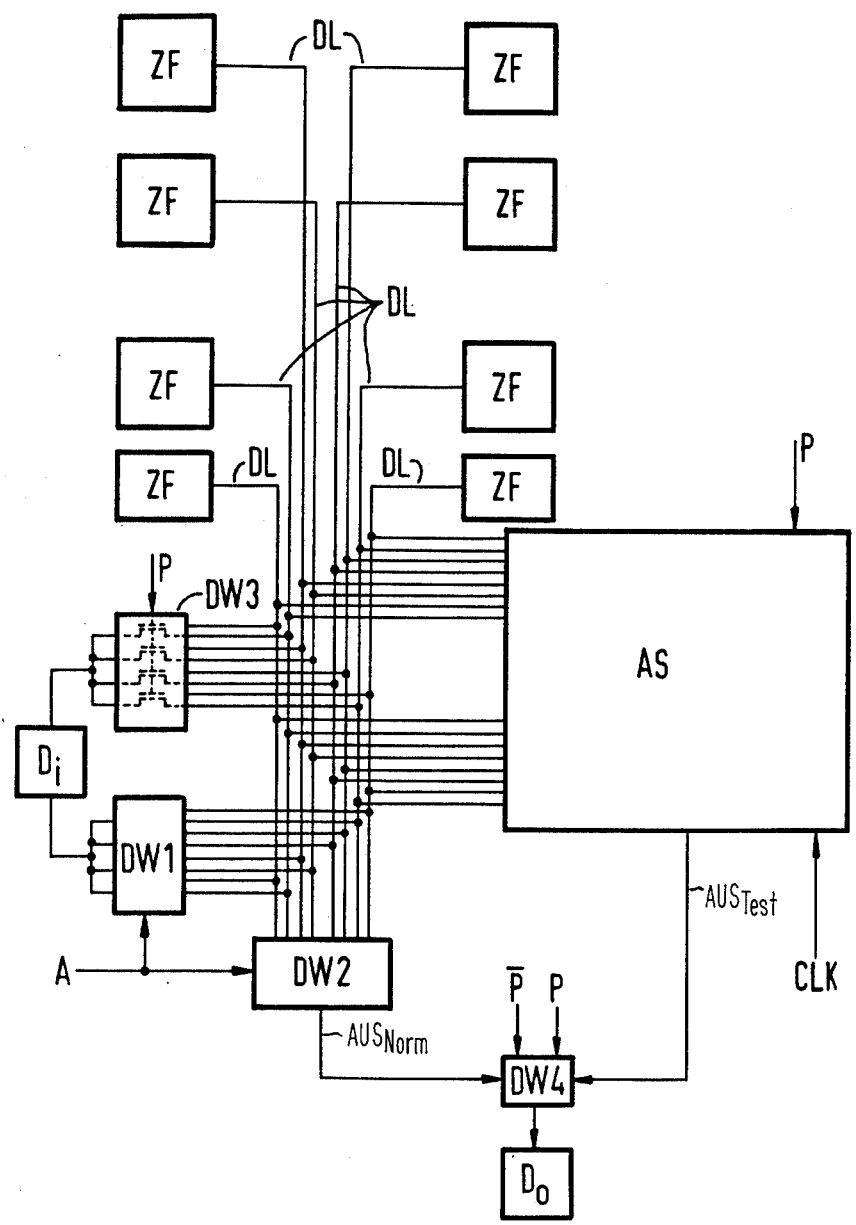
FIG. 5 is a diagram of the first embodiment of the invention, applied to a memory with eight cell fields.

FIG. 5 shows an embodiment of a semiconductor memory according to the invention, in which n=8 cell fields ZF are used instead of n=4 cell fields ZF. The operation of the semiconductor memory is the same as described for FIG. 1. However, in the testing operation, a even greater reduction of the testing time is achieved.

Figure 6:
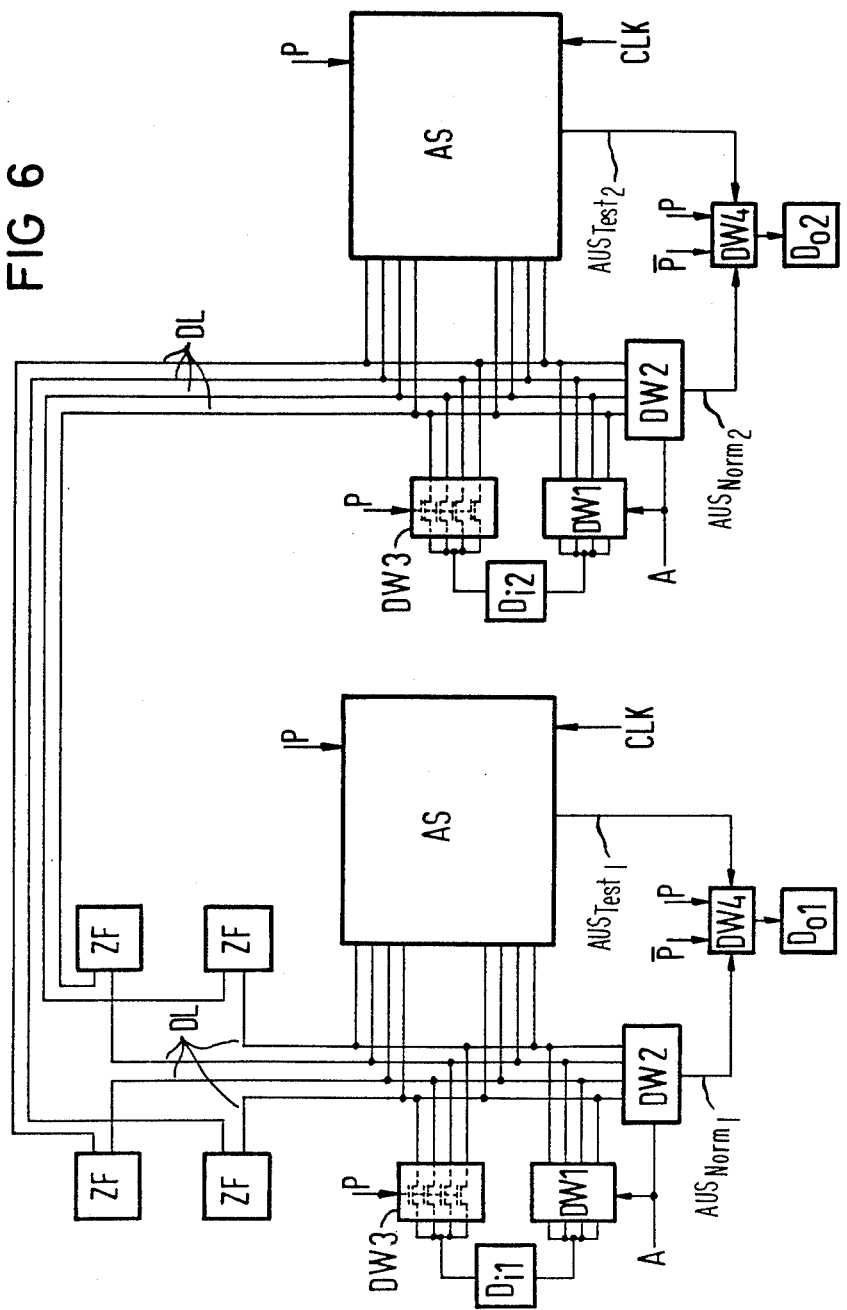
FIG. 6 is a diagram of the first embodiment of the invention, applied to a memory with data interfaces with a width of 2 bits.

FIG. 6 shows an embodiment of a semiconductor memory according to the invention in which n=4 cell fields ZF are again used, but which has a width of m=2 bits at the data interfaces. The operation is the same as described with respect to FIG. 1. It should only be clarified that both illustrated first data separators DW1, second data separators DW2, third data separators DW3, fourth data separators DW4, the cell fields ZF as well as the two evaluation circuits AS, each work in parallel to each other and independently of each other. In order to illustrate the fact that the data interfaces of the m=2 bits carry information independently of each other, the designations $D_{i1}$, $D_{o1}$, $D_{i2}$, $D_{o2}$, $AUS_{Test\ 1}$, $AUS_{Test\ 2}$, $AUS_{Norm\ 1}$, and $AUS_{Norm\ 2}$ are chosen instead of the designations $D_i$, $D_o$, $AUS_{Test}$ and $AUS_{Norm}$.

Furthermore, different embodiments of the invention are possible, particularly regarding the construction of the evaluation circuit AS. However, all of the embodiments are within the scope of the invention, because it is not a problem for one of ordinary skill in the art to modify the logic circuits shown without deviating from the formulation of the invention or from the basic idea of the invention.

The foregoing is a description corresponding in substance to German Application P No. 34 47 762.4, filed Dec. 28, 1984, the International priority of which is being claimed for the instant application, and which is hereby made part of this application. Any material discrepancies between the foregoing specification and the aforementioned corresponding German application are to be resolved in favor of the latter.

I claim:

1. Integrated semiconductor memory, comprising n identical memory cell fields each having a data width equal to m wherein n and m are positive integers, nm data lines, m of said nm data lines being connected with one of said memory cell fields for writing-in and reading-out memory data into and out of said memory cell fields, m first data separators each being connected to n of said nm data lines and each having an assigned data input terminal for applying the memory data present at said assigned data input terminal to be written into one of said n data lines of the semiconductor memory as a function of addressing data when written-in, m second data separators each being connected to n of said nm data lines and each having an output for selecting one of said n data lines in response to the addressing data when reading out the memory data present at said n data lines and for applying the memory data to said outputs of said second data separators, m data output terminals connected to said outputs of said second data separators for receiving the memory data, first terminal means for providing a control signal, second terminal means for providing a signal complementary to said control signal, evaluation circuits each having an output and each being connected to said first terminal means and to n of said nm data lines parallel to said respective second data separators for feeding through the memory data read out from said memory cell fields to said outputs of said evaluation circuits and in turn to said data output terminals in response to said control signal, and for activating an error signal to said data output terminals upon the occurrence of at least one faulty memory data, third data separators connected to said first terminal means and connected between each of said m data imput terminals and said n of nm data lines parallel to said first data separators for transferring the memory data to be written into the semiconductor memory in parallel to all of said n data lines in response to said control signal, and fourth data separators each being connected to said first and second terminal means and each being connected between a respective one of said m data output terminals and said outputs of a respective one of said second data separators and of a respective one of said evaluation circuits for selectively feeding the memory data selected by said second data separators and the output signal generated by said evaluation circuit to said data output terminals in response to said control signal and said complementary signal.

2. Integrated semiconductor memory according to claim 1, wherein each of said evaluation circuits comprises means for feeding through the memory data read out from said memory cell fields, said feeding means including a setting circuit having an output, a first multivibrator circuit having a setting input connected to and activated by said data lines if all n data lines connected to said evaluation circuit have a first logical state, a resetting input connected to and activated by said data lines if all of said data lines connected to said evaluation circuit have a second logical state complementary to said first logical state, and an output connected to said output of said evaluation circuit being intentionally set and reset if all n data lines have the same logical state, a second multivibrator circuit having an output connected to said output of said evaluation circuit, a resetting input connected to said data lines for resetting said output of said second multivibrator circuit if all n data lines connected to said evaluation circuit together have neither said first nor said second logical states, and a setting input connected to and addressed by said output of said setting circuit for setting said output of said second multivibrator circuit.

3. Integrated semiconductor memory according to claim 2, wherein each of said setting circuits includes a differentiating stage having an output connected to said output of said setting circuit and an input for receiving said control signal from said first terminal means and for receiving a supply voltage for the semiconductor memory, and an AND function device having an output connected to said output of said setting circuit, an input connected to said setting input of said first multivibrator circuit, and another input for receiving a machine clock frequency.

4. Integrated semiconductor memory according to claim 3, wherein said machine clock frequency delays said setting inputs of said second multivibrator circuits within a given clock period until a test circuit connected to said data output terminal has recognized an error signal which may have been activated during a previous clock period.

5. Integrated semiconductor memory according to claim 2 wherein each of said evaluation circuits includes a logic function device having an output forming said output of said evaluation circuit, and two inputs each being connected to a respective one of said outputs of said multivibrator circuits.

6. Integrated semiconductor memory according to claim 1, wherein each of said third data separators includes n transistors each being connected between an associated data input terminal and a respective one of said data lines for said data input terminal, and said transistors have gates connected in parallel to said first terminal means.

7. Integrated semiconductor memory according to claim 1, wherein each of said m fourth data separators each include first and second transistors having source, drain and gate terminals, said drain terminals of said first and second transisters being connected together to an associated data output terminal, said source terminal of said first transistor being connected to said output of an associated second data separator, said source terminal of said second transistor being connected to said output of an associated evaluation circuit, said gate terminal of said first transistor being connected to said second terminal means, and said gate terminal of said second transistor being connected to said first terminal means.

8. Integrated semiconductor memory according to claim 1, wherein said first terminal means is a separate terminal used exclusively for said control signal.

9. Integrated semiconductor memory according to claim 1, wherein said first terminal means is a terminal which is also used for other signals from the semiconductor memory.

10. Integrated semiconductor memory according to claim 9, wherein said first terminal means receives the most significant of the addressing signals during normal operation.

11. Integrated semiconductor memory according to claim 10, wherein said control signal is at a higher potential than that which corresponds to a logical "1", for switching from normal operation to testing operation in which said evaluation circuits are used.

12. Integrated semiconductor memory according to claim 11, wherein said first terminal means includes a discriminator circuit for recognizing whether or not said higher potential is applied and for activating said control signal.

13. Integrated semiconductor memory according to claim 9, wherein said control signal is at a higher potential than that which corresponds to a logical "1", for switching from normal operation to testing operation in which said evaluation circuits are used.

14. Integrated semiconductor memory according to claim 13, wherein said first terminal means includes a discriminator circuit for recognizing whether or not said higher potential is applied and for activating said control signal.

15. Integrated semiconductor memory, comprising n identical memory cell fields each having a data width equal to m wherein n and m are positive integers, nm data lines, n of said nm data lines being connected with one of said memory cell fields for writing-in and reading-out memory data into and out of said memory cell fields, m first data separators each being connected to n of said nm data lines and each having an assigned data input terminal for applying the memory data present at said assigned data input terminal to be written into one of said n data lines of the semiconductor memory as a function of addressing data when written-in, m second data separators each being connected to n of said nm data lines and each having an output for selecting one of said n data lines in response to the addressing data when reading out the memory data present at said n data lines and for applying the memory data to said outputs of said second data separators, data output terminals connected to said outputs of said second data separators for receiving the memory data, terminal means for providing a control signal, evaluation circuits each having an output and each being connected to said terminal means and to n of said nm data lines parallel to said respective second data separators for feeding through the memory data read out from said memory cell fields to said output terminals in response to said control signal, and for activating an error signal to said data output terminals upon the occurrence of at least one faulty memory data, third data separators connected to said terminal means and connected between each of said m data input terminals and said n of nm data lines parallel to said first data separators for transferring the memory data to be written into the semiconductor memory in parallel to all of said n data lines in response to said control signal, and other terminals each being connected to a respective one of said outputs of said evaluation circuits and being used exclusively therefor.

* * * * *